(12) United States Patent
Lin

(10) Patent No.: US 11,302,229 B2
(45) Date of Patent: Apr. 12, 2022

(54) DISPLAY PANEL AND DISPLAY APPARATUS

(71) Applicant: HKC CORPORATION LIMITED, Shenzhen (CN)

(72) Inventor: Pei Hsin Lin, Chongqing (CN)

(73) Assignee: HKC CORPORATION LIMITED, Shenzhen (CN)

(*) Notice: Subject to any disclaimer, the term of this patent is extended or adjusted under 35 U.S.C. 154(b) by 567 days.

(21) Appl. No.: 16/319,811

(22) PCT Filed: Nov. 21, 2018

(86) PCT No.: PCT/CN2018/116610
§ 371 (c)(1),
(2) Date: Jan. 22, 2019

(87) PCT Pub. No.: WO2020/093453
PCT Pub. Date: May 14, 2020

(65) Prior Publication Data
US 2021/0335174 A1    Oct. 28, 2021

(30) Foreign Application Priority Data

Nov. 16, 2018  (CN) .......................... 201821823522.1

(51) Int. Cl.
*G09G 3/20* (2006.01)

(52) U.S. Cl.
CPC ....... *G09G 3/20* (2013.01); *G09G 2300/0426* (2013.01); *G09G 2310/0267* (2013.01); *G09G 2310/0286* (2013.01); *G09G 2310/08* (2013.01)

(58) Field of Classification Search
CPC ............. G09G 3/20; G09G 2300/0426; G09G 2310/0267; G09G 2310/0286; G09G 2310/08
See application file for complete search history.

(56) References Cited

U.S. PATENT DOCUMENTS

| 2005/0180072 A1 | 8/2005 | Lai |
| 2020/0294978 A1* | 9/2020 | Go .......................... H01L 24/05 |
| 2021/0118402 A1* | 4/2021 | Cho ..................... G09G 3/2096 |

FOREIGN PATENT DOCUMENTS

| CN | 1982959 A | 6/2007 |
| CN | 101290408 A | 10/2008 |
| CN | 103943611 A | 7/2014 |
| CN | 104817106 A | 5/2015 |
| KR | 20150124210 A | 11/2015 |

OTHER PUBLICATIONS

International Search Report issued in corresponding International application No. PCT/CN2018/116610, dated Aug. 8, 2019 (8 pages).
Written Opinion of the International Searching Authority for No. PCT/CN2018/118610.

* cited by examiner

*Primary Examiner* — Sejoon Ahn

(57) ABSTRACT

This application discloses a display panel and a display apparatus. The display panel includes a first signal line and a second signal line; an overlapping region is formed at an intersection of the second signal line and the first signal line; and the first signal line includes at least two sub-connection lines and the connection line crosses the overlapping region.

15 Claims, 6 Drawing Sheets

DISPLAY PANEL AND DISPLAY APPARATUS

This application claims priority to Chinese Patent Application No. CN201821823522.1, filed with the Chinese Patent Office on Nov. 6, 2018, and entitled "DISPLAY PANEL AND DISPLAY APPARATUS", which is incorporated herein by reference in its entirety.

TECHNICAL FIELD

This application relates to the field of display technologies, and in particular, to a display panel and a display apparatus.

BACKGROUND

It should be understood that descriptions herein merely provide background information related to this application, and do not necessarily constitute the prior art. With development and advancement of science and technologies, owing to hot spots such as thin body, power saving, and low radiation, displays become mainstream products of displays and are widely applied. A flat panel display includes a thin film transistor-liquid crystal display (TFT-LCD), an organic light-emitting diode (OLED) display, and the like. The TFT-LCD controls rotating directions of liquid crystal molecules, to enable light in a backlight module to be refracted out to generate a picture, and the TFT-LCD has various advantages such as thin body, power saving, and no radiation. The OLED display is manufactured by using an organic electroluminescent diode, and has various advantages such as self-luminescent, short response time, high resolution and contrast, flexible display, and large area full color display.

A frame of a display has a lot of wires, a short circuit occurs between two signal lines when a particle drops onto the wires and causes a misoperation, with a result that a circuit transmission fails and a yield is reduced.

SUMMARY

An objective of this application is to provide a display panel and a display apparatus, so as to enhance a display yield.

This application provides a display panel. The display panel comprises a first signal line and a second signal line, wherein the first signal line and the second signal line are different metal layers; an overlapping region is formed at an intersection of the second signal line and the first signal line; and the first signal line comprises a connection line, the connection line comprises at least two sub-connection lines, and the connection line crosses the overlapping region.

Optionally, the first signal line further comprises at least two sub-signal lines, two neighboring sub-signal lines are respectively arranged at two sides of the overlapping region, and the two neighboring sub-signal lines are connected through the connection line.

Optionally, the connection line comprises a first sub-connection line, a second sub-connection line, and a third sub-connection line, and the first sub-connection line and the third sub-connection line are arranged symmetrically relative to the second sub-connection line.

Optionally, a line length of the second sub-connection line is less than a line length of the first sub-connection line and a line length of the third sub-connection line, and the line length of the first sub-connection line is equal to the line length of the third sub-connection line.

Optionally, a clearance between the two neighboring sub-signal lines is equal to a width of the overlapping region.

Optionally, a clearance between the two neighboring sub-signal lines is greater than a width of the overlapping region.

Optionally, a clearance between an outer edge of the first sub-connection line and an outer edge of the third sub-connection line is greater than a line width of the signal line.

Optionally, the connection line comprises a first sub-connection line and a third sub-connection line, and the first sub-connection line and the third sub-connection line are arranged symmetrically relative to the neighboring sub-signal lines.

Optionally, a line length of the first sub-connection line is equal to a line length of the third sub-connection line.

Optionally, the connection line comprises a first sub-connection line and a second sub-connection line, and the first sub-connection line and the second sub-connection line are arranged in parallel; and a length of the first sub-connection line and a length of the second sub-connection line are equal to a length of the first signal line.

Optionally, the display panel comprises a timing control circuit configured to provide drive timing of a scanning drive circuit; and the scanning drive circuit configured to drive a scan line of the display panel, wherein one end of the first signal line is connected to the scanning drive circuit and the other end of the first signal line is connected to the second signal line; and the second signal line is connected to the timing control circuit.

Optionally, the scanning drive circuit comprises a plurality of shift register chips; each shift register chip corresponds to a group of first signal lines; each group of first signal lines comprises a first transmission signal line and a second transmission signal line; and starting from an end away from the shift register chips, the second signal line comprises a power line, a first clock signal line, a second clock signal line, a third clock signal line, and a fourth clock signal line in sequence;

the first transmission signal line is connected to the power line; the first transmission signal line crosses the first clock signal line, the second clock signal line, the third clock signal line, and the fourth clock signal line to respectively form four overlapping regions; every four neighboring shift register chips form one group, and the second transmission signal line is connected to the first clock signal line, the second clock signal line, the third clock signal line, and the fourth clock signal line sequentially; and the connection line is arranged corresponding to each overlapping region.

Optionally, the scanning drive circuit comprises a plurality of shift register chips; each shift register chip corresponds to a group of first signal lines; each group of first signal lines comprises a first transmission signal line, a second transmission signal line, and a third transmission signal line; and the second signal line comprises a power line, a first clock signal line, and a second clock signal line;

the power line is connected to the first transmission signal line; the first transmission signal line crosses the first clock signal line and the second clock signal line to respectively form two of the overlapping regions, the second transmission signal line is connected to the first clock signal line to form an overlapping region, the third transmission signal line is connected to the second clock signal line, and the connection line is arranged corresponding to each overlapping region.

This application further discloses a display panel. The display panel comprises a first signal line and a second signal line; an overlapping region is formed at an intersection of the second signal line and the first signal line; the first signal line comprises a connection line, the connection line comprises at least two sub-connection lines, and the first signal line further comprises two neighboring sub-signal lines, and the two neighboring sub-signal lines are connected through the connection line; a clearance between the two neighboring sub-signal lines is equal to a width of the overlapping region; the connection line comprises a first sub-connection line, a second sub-connection line, and a third sub-connection line; the first sub-connection line and the third sub-connection line are arranged symmetrically relative to the second sub-connection line; a line length of the second sub-connection line is less than a line length of the first sub-connection line and a line length of the third sub-connection line, and the line length of the first sub-connection line is equal to the line length of the third sub-connection line; and a clearance of the connection line is greater than a line width of the signal line, a clearance between a first edge of the first sub-connection line and a first edge of the third sub-connection line is greater than the line width of the signal line, and the connection line is arranged corresponding to each overlapping region.

This application further discloses a display panel.

The display apparatus comprises a display panel.

The display panel comprises:

a first signal line; and a second signal line, wherein the first signal line and the second signal line are different metal layers;

an overlapping region is formed at an intersection of the second signal line and the first signal line; and the first signal line comprises a connection line, the connection line comprises at least two sub-connection lines, and the connection line crosses the overlapping region.

Optionally, the first signal line further comprises at least two sub-signal lines, two neighboring sub-signal lines are respectively arranged at two sides of the overlapping region, and the two neighboring sub-signal lines are connected through the connection line.

Optionally, the connection line comprises a first sub-connection line, a second sub-connection line, and a third sub-connection line;

the first sub-connection line and the third sub-connection line are arranged symmetrically relative to the second sub-connection line; and a clearance between an outer edge of the first sub-connection line and an outer edge of the third sub-connection line is greater than line widths of both the two neighboring sub-signal lines.

Optionally, a clearance between the two neighboring sub-signal lines is greater than and equal to a width of the overlapping region.

Optionally, the connection line comprises a first sub-connection line and a second sub-connection line, and the first sub-connection line and the second sub-connection line are arranged in parallel; and a length of the first sub-connection line and a length of the second sub-connection line are equal to a length of the first signal line.

If only one horizontal path of the first signal line is provided in an example, only one path exists when a conductive particle drops onto these wires, and therefore, a signal received by a shift register chip is incorrect, causing transmission to fail. The first signal line in this application includes at least two sub-connection lines that also cross the overlapping region where a particle is easily dropped off, and therefore, a signal can be transmitted to a circuit of the shift register chip correctly from other paths. In this way, the circuit of the shift register chip can operate normally and a yield can be enhanced.

BRIEF DESCRIPTION OF DRAWINGS

The accompanying drawings included are used for helping further understand embodiments of this application, constitute a part of this specification, illustrate examples of the embodiments of this application and, together with the description, serve to explain the principles of this application. Obviously, the accompanying drawings described below are only some embodiments of this application, and persons of ordinary skill in the art can obtain other accompanying drawings according to these accompanying drawings without creative efforts. In the accompanying drawings.

DETAILED DESCRIPTION

Figure 1:
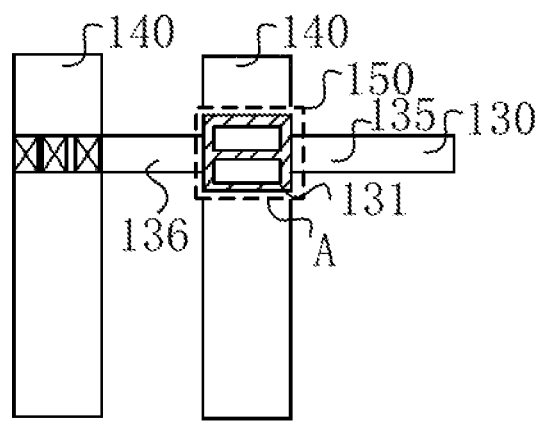
FIG. 1 is a schematic diagram of a signal line according to an embodiment of this application.

Specific structures and functional details disclosed herein are merely representative, and are intended to describe the objectives of the exemplary embodiments of this application. However, this application may be specifically implemented in many alternative forms, and should not be construed as being limited to the embodiments set forth herein.

In the description of this application, it should be understood that orientation or position relationships indicated by the terms such as "center", "transverse". "on", "below", "left", "right", "vertical". "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly include one or more of said features. In the description of this application, unless otherwise stated, "a plurality of" means two or more than two. In addition, the terms "include", "comprise" and any variant thereof are intended to cover non-exclusive inclusion.

In the description of this application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in this application according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "comprise" used in this specification specify the presence of stated features, integers, steps, operations, elements, and/or components, but do not preclude the presence or addition of one or more other features, integers, steps, operations, elements, components, and/or combinations thereof.

This application is further described below with reference to the accompanying drawings and optional embodiments.

As shown in FIG. 1, an embodiment of this application discloses a display panel 100. The display panel 100 includes a first signal line 130 and a second signal line 140; the first signal line 130 and the second signal line 140 are different metal layers; an overlapping region 150 is formed at an intersection of the second signal line 140 and the first signal line 130; and the first signal line 130 includes a connection line 131, the connection line 131 includes at least two sub-connection lines, and the connection line 131 crosses the overlapping region 150.

If only one horizontal path is provided in an example, only one path exists when a conductive particle drops onto these wires, and therefore, a signal received by a shift register chip 124 is incorrect, causing transmission to fail. In this application, the first signal line 130 includes at least two sub-connection lines, that is, two sub-paths, the connection line 131 also crosses the overlapping region 150 where a particle is easily dropped off, and therefore, a signal can be transmitted to a circuit of the shift register chip 124 correctly from other paths. In this way, the circuit of the shift register chip 124 can operate normally and a yield can be enhanced.

As shown in FIG. 1, in an embodiment, the first signal line 130 further includes at least two sub-signals, two neighboring sub-signals are respectively arranged at two sides of the overlapping region 150; and the two neighboring sub-signals are connected through the connection line 131.

In this solution, a capacitance exists in the overlapping region 150 of the first signal line 130 and the second signal line 140 due to a difference between an upper voltage and a lower voltage. Some conductive particles are unstable and easily drop onto the first signal line 130 in the overlapping region 150. The path of the current connection line 131 replaces the exemplary transmission path, and the connection line connects a first sub-signal line 135 and a second sub-signal line 136 neighboring to each other, so that the first signal line 130 forms a path, and the connection line 131 can provide a plurality of paths to resolve a signal transmission error caused by a short circuit in the overlapping region 150.

Figure 2:
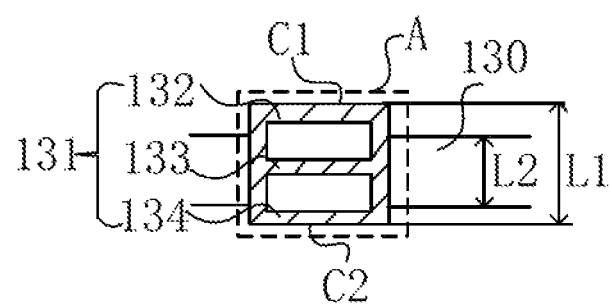
FIG. 2 is a schematic diagram of a connection line according to an embodiment of this application.

As shown in FIG. 2, in an embodiment, the connection line 131 includes a first sub-connection line 132, a second sub-connection line 133, and a third sub-connection line 134; the first sub-connection line 132 and the third sub-connection line 134 are arranged symmetrically relative to the second sub-connection line 133; and a line length of the second sub-connection line 133 is less than a line length of the first sub-connection line 132 and a line length of the third sub-connection line 134, and a line length of the first sub-connection line 132 is equal to a line length of the third sub-connection line 134.

In this solution, a region A is a connection line area, and the connection line has three sub-connection lines. A larger quantity of the sub-connection lines indicates a larger quantity of the sub-paths. If a path is obstructed, the path can be cut by laser to isolate a particle area that causes a short circuit, and a signal can be transmitted to the shift register chip 124 through the other two paths, so that the shift register chip 124 can obtain a correct signal, thereby enhancing correctness of the circuit and enhancing a yield.

As shown in FIG. 1, in an embodiment, a clearance between the two neighboring sub-signal lines is equal to a width of the overlapping region 150.

In this solution, the overlapping region 150 is aligned directly to be repaired. The connection line in the overlapping region 150 has a plurality of paths, so that a conductive particle that is unstable here can be transmitted through selecting one of other paths when failing to be transmitted in one path due to a short circuit.

Figure 3:
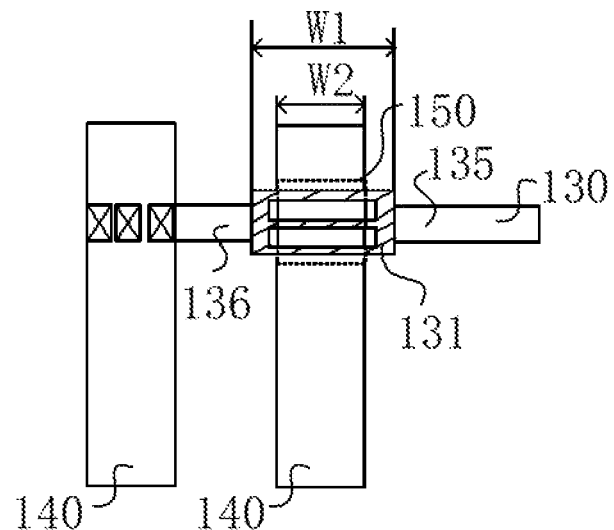
FIG. 3 is a schematic diagram of another signal line according to an embodiment of this application.

As shown in FIG. 3, in an embodiment, a clearance between the two neighboring sub-signal lines is greater than a width of the overlapping region 150.

In this solution, a range of the connection line has exceeded the overlapping region 150. The clearance is W1, and the width of the overlapping region 150 is W2. A line width area of the first signal line 130 is reduced as a whole, an overlapping area of the first signal line 130 and the second signal line 140 is reduced, thereby reducing the entire capacitance and enhancing a signal transmission rate.

As shown in FIG. 2, in an embodiment, a clearance between an outer edge of the first sub-connection line 132 and an outer edge of the third sub-connection line 134 is greater than a line width of the first signal line 130.

In this solution, C1 is an outer edge of the first sub-connection line 132, and C2 is an outer edge of the third sub-connection line 134. The clearance between the two outer edges is L1, and the line width of the first signal line 130 is L2, L2 being greater than L1. The clearance between the outer edge of the first sub-connection line 132 and the outer edge of the third sub-connection line 134 is greater than the line width of the first signal line 130, thereby reducing an overlapping area of the overlapping region 150 and a capacitance, increasing a signal transmission rate, avoiding a signal transmission delay, and remaining a sufficient clearance to make an easy laser cut and isolate a short circuit region after a short circuit occurs, so that manipulability is high.

Figure 4:
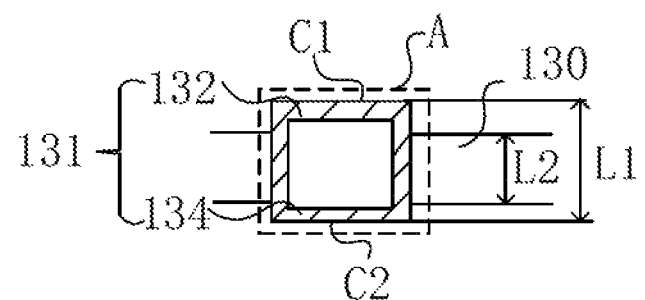
FIG. 4 is a schematic diagram of another connection line according to an embodiment of this application.

As shown in FIG. 4, in an embodiment, the connection line 131 includes a first sub-connection line 132 and a third sub-connection line 134; the first sub-connection line 132 and the third sub-connection line are arranged symmetrically relative to the neighboring sub-signal lines; and a line length of the first sub-connection line 132 is equal to a line length of the third sub-connection line 134.

This solution provides two sub-connection lines but does not provide the second sub-connection line, thereby reducing an overlapping area with the second signal line 140, reducing a capacitance, and reducing a possibility that a particle drops onto the connection line.

Figure 5:
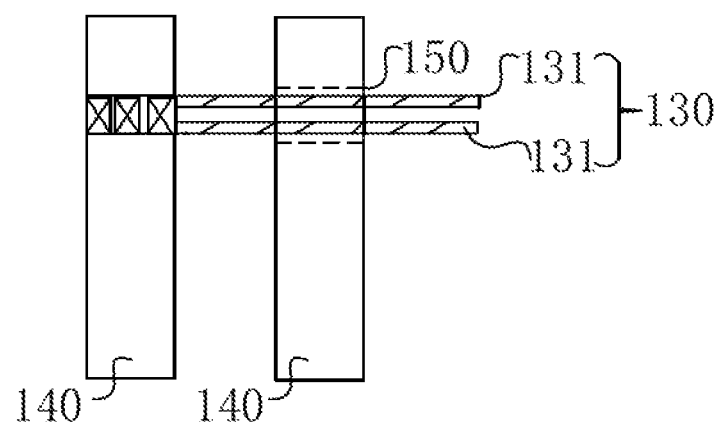
FIG. 5 is a schematic diagram of another connection line according to an embodiment of this application.

As shown in FIG. 5, in an embodiment, the connection line 131 includes a first sub-connection line 132 and a second sub-connection line 133 that are arranged in parallel;

and a length of the first sub-connection line 132 and a length of the second sub-connection line 133 is equal to a length of the first signal line 130. The second signal line 140 is still formed by a single wire, and the first sub-connection line 132 and the second sub-connection line 133 form an overlapping region 150 with the second signal line 140.

In this solution, the first signal line is completely formed by two parallel sub-connection lines, and a short circuit fault generated not only in the overlapping region but also in any other positions can be repaired, so as to widen the application scope of the concept of this application.

Figure 6:
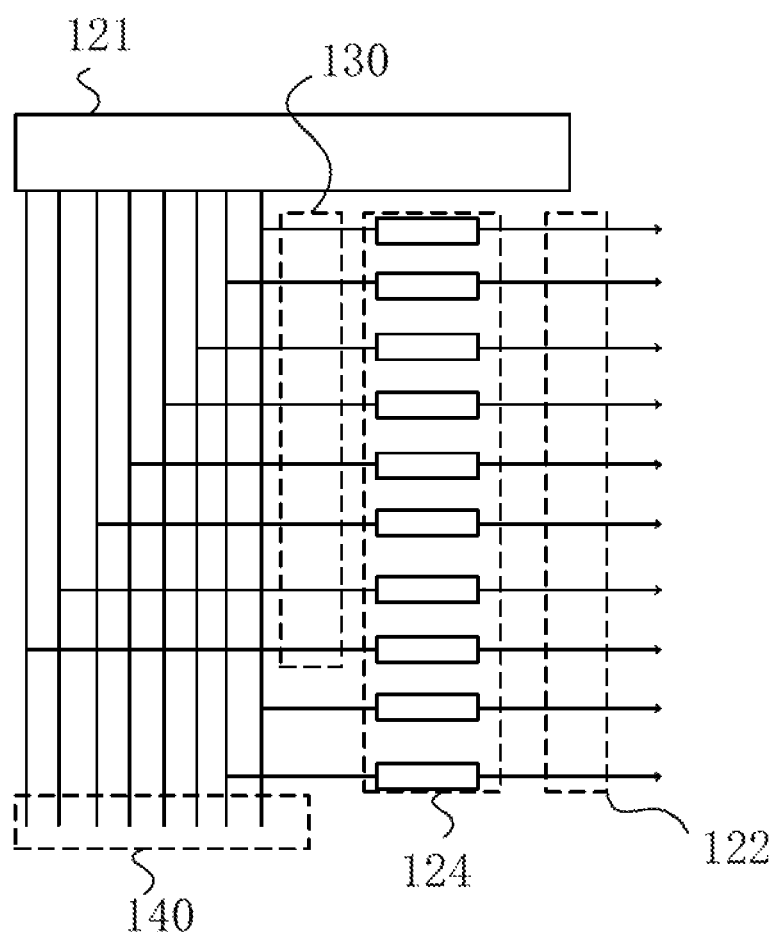
FIG. 6 is a schematic diagram of a drive circuit according to an embodiment of this application.

As shown in FIG. 6, in an embodiment, the display panel 100 includes a timing control circuit 121 and a scanning drive circuit 122. The timing control circuit 121 is configured to provide drive timing for the scanning drive circuit 122, and the scanning drive circuit 122 is configured to drive a scan line of the display panel 100; one end of the first signal line 130 is connected to the scanning drive circuit 122 and the other end of the first signal line 130 is connected to the second signal line 140; and the second signal line 140 is connected to the timing control circuit 121.

In this solution, the timing control circuit 121 provides a drive program for the scanning drive circuit 122, the scanning drive circuit 122 controls the scan lines in a display area 110, and the first signal line 130 and the second signal line 140 are connected to form a path to transmit a signal.

Figure 7:
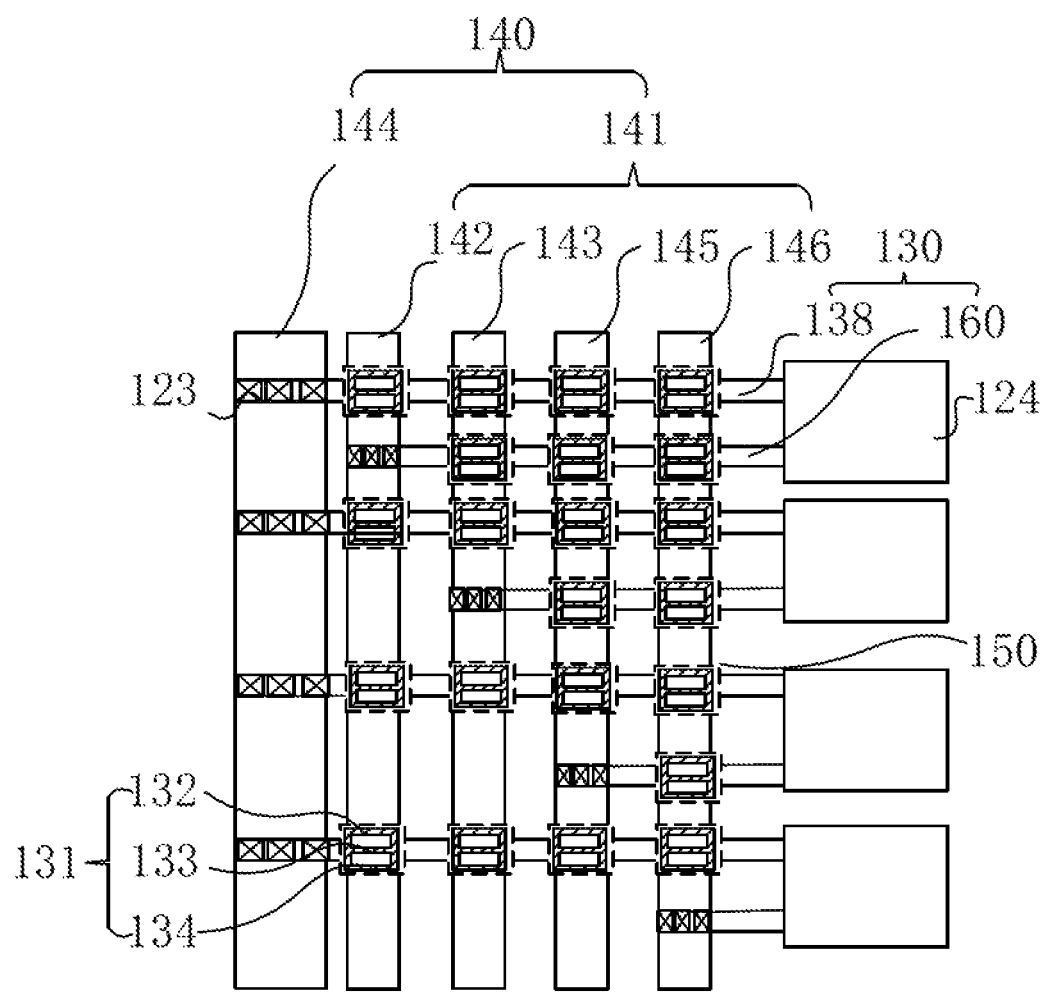
FIG. 7 is a schematic diagram of four clock signal lines according to an embodiment of this application.

As shown in FIG. 7, in an embodiment, the scanning drive circuit 122 includes a plurality of shift register chips 124; each shift register chip 124 corresponds to a group of first signal lines 130; each group of first signal lines 130 includes a first transmission signal line 138 and a second transmission signal line 160; and starting from an end away from the shift register chips 124, the second signal line 140 includes a power line 144, a first clock signal line 142, a second clock signal line 143, a third clock signal line 145, and a fourth clock signal line 146 in sequence.

The first transmission signal line 138 is connected to the power line 144; the first transmission signal line 138 crosses the first clock signal line 142, the second clock signal line 143, the third clock signal line 145, and the fourth clock signal line 146 to respectively form four overlapping regions 150; every four neighboring shift register chips 124 form one group, and the second transmission signal line 160 is sequentially connected to the first clock signal line 142, the second clock signal line 143, the third clock signal line 145, and the fourth clock signal line 146; and the connection line 131 is arranged corresponding to each overlapping region 150.

In this solution, the overlapping regions 150 of the four clock signal lines and the transmission signal lines have connection lines respectively and correspondingly, thereby ensuring correctness of signal transmission and enhancing a yield.

Figure 8:
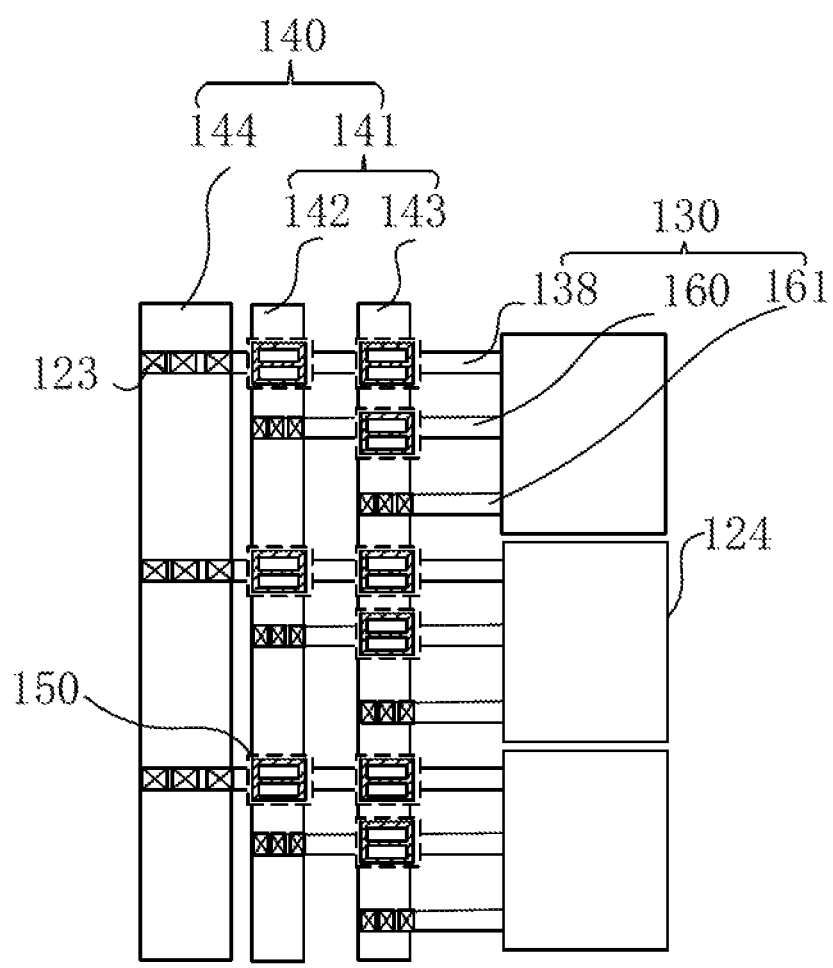
FIG. 8 is a schematic diagram of two clock signal lines according to an embodiment of this application.
Figure 9:
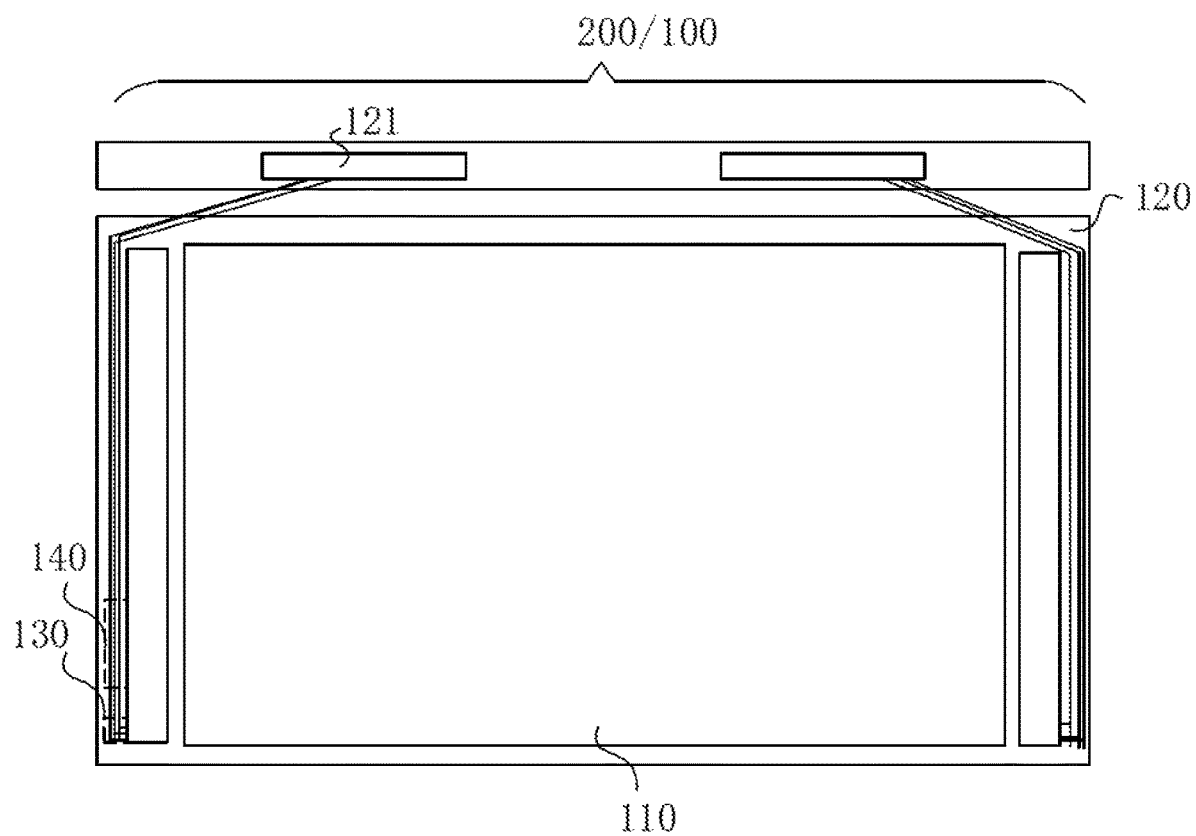
FIG. 9 is a schematic diagram of a display apparatus according to an embodiment of this application.

As shown in FIG. 8, in an embodiment, the scanning drive circuit 122 includes a plurality of shift register chips 124; each shift register chip 124 corresponds to a group of first signal lines 130; each group of first signal lines 130 includes a first transmission signal line 138, a second transmission signal line 160, and a third transmission signal line 161; and the second signal line 140 includes a power line 144, a first clock signal line 142, and a second clock signal line 143.

The power line 144 is connected to the first transmission signal line 138; the first transmission signal line 138 crosses the first clock signal line 142 and the second clock signal line 143 to respectively form two overlapping regions 150; the second transmission signal line 160 is connected to the first clock signal line 142 and crosses the second clock signal line 143 to form an overlapping region 150; the third transmission signal line 161 is connected to the second clock signal line and forms no overlapping region 150; and the connection lines are arranged corresponding to each overlapping region 150.

In this solution, two clock signal lines 141 are provided, the connection lines 131 are arranged in the crossed overlapping regions 150 corresponding to the power line and the transmission signal lines, and for a conductive particle dropping off in the overlapping region 150, the connection line 131 can have a plurality of selection paths, thereby ensuring correctness of transmission.

In another embodiment of this application, referring to FIG. 1 to FIG. 8, a display panel 100 is disclosed and includes a first signal line 130 and a second signal line 140. The first signal line 130 and the second signal line 140 are different metal layers, and the first signal line and the second signal line are intersected to form an overlapping region 150.

The first signal line 130 includes a connection line 131 that includes at least two sub-connection lines. The first signal line 130 further includes two neighboring sub-signal lines, and the two neighboring sub-signal lines are connected through the connection line 131. A clearance between the two neighboring sub-signal lines is equal to a width of the overlapping region 150. The connection line 131 includes a first sub-connection line 132, a second sub-connection line 133, and a third sub-connection line 134. The first sub-connection line 132 and the third sub-connection line are arranged symmetrically relative to the second sub-connection line 133. A line length of the second sub-connection line 133 is less than a line length of the first sub-connection line 132 and a line length of the third sub-connection line 134, and the line length of the first sub-connection line 132 is equal to the line length of the third sub-connection line 134. A clearance of the connection line 131 is greater than a line width of the signal line, a clearance between an outer edge of the first sub-connection line 132 and an outer edge of the third sub-connection line 134 is greater than the line width of the signal line. Two first edges and the second sub-connection line 133 are arranged in parallel, and the connection line 131 is arranged corresponding to each overlapping region 150. The display panel 100 further includes a metal bridging hole 123; and one end of one power line is connected to a common power line through the metal bridging hole 123 and the other end of the power line is connected to the shift register chip 124. One end of each of the two transmission signal lines is connected to the two clock signal lines through the metal bridging hole 123 and the other end of each of the two transmission signal lines is connected to the shift register chip 124.

In this solution, the first signal line 130 includes the first transmission signal line 138 and two other signal lines. The second signal line 140 includes the power line 144 and two clock signal lines. The transmission signal line, the first signal line 138 and the clock signal line 141 are intersected to form an overlapping region 150. In this region, voltages passing through the clock signal line, the transmission signal line, and the first signal line 138 are different, causing a voltage difference. Consequently, a capacitance occurs and causes some conductive particles to be unstable and it is unavoidable that some conductive particles may be scattered on the transmission signal line in a working state. The overlapping region 150 is directly aligned to be repaired, thereby enhancing efficiency. The connection line is arranged in the overlapping region 150, the connection line 131 has three paths, and lengths of the sub-connection lines are different, so that a subsequent laser cutting operation can be performed easily. Compared with the exemplary path, more paths are provided for selection, a certain path of the connection line on which a conductive particle drops is isolated and cut by laser, so as to ensure that other paths still can transmit a signal. An edge clearance of the connection line is also greater than the line width of the sub-signal line, thereby reducing the overlapping area and capacitance, enhancing a rate and correctness of signal transmission and then enhancing a yield.

In another embodiment of this application, referring to FIG. 1 to FIG. 9, a display apparatus 200 is disclosed. The display apparatus 200 includes the foregoing display panel 100.

The display apparatus includes the display panel.

The technical solutions of this application can be widely applied to a flat panel display such as a TFT-LCD and an OLED display.

The foregoing contents are detailed descriptions of this application in conjunction with specific optional embodiments, and it should not be considered that the specific implementation of this application is limited to these descriptions. Persons of ordinary skill in the art can further make simple deductions or replacements without departing from the concept of this application, and such deductions or replacements should all be considered as falling within the protection scope of this application.

What is claimed is:

1. A display panel, comprising:
a first signal line; and
a second signal line, wherein the first signal line and the second signal line are metal layers disposed at different layers at different locations;
an overlapping region is formed at an intersection of the second signal line and the first signal line; and
the first signal line comprises a connection line, the connection line comprises at least two sub-connection lines, and the connection line crosses the overlapping region;
wherein the display panel further comprises:
a timing control circuit, configured to provide drive timing of a scanning drive circuit; and
the scanning drive circuit, configured to drive a scan line of the display panel, wherein
one end of the first signal line is connected to the scanning drive circuit, and the other end of the first signal line is connected to the second signal line; and
the second signal line is connected to the timing control circuit;
wherein the scanning drive circuit comprises a plurality of shift register chips; each shift register chip corresponds to a group of first signal lines; each group of first signal lines comprises a first transmission signal line and a second transmission signal line; and starting from an end away from the shift register chips, the second signal line comprises a power line, a first clock signal line, a second clock signal line, a third clock signal line, and a fourth clock signal line in sequence; and
the first transmission signal line is connected to the power line; the first transmission signal line crosses the first clock signal line, the second clock signal line, the third clock signal line, and the fourth clock signal line to respectively form four overlapping regions; every four neighboring shift register chips form one group, and the second transmission signal line is sequentially connected to the first clock signal line, the second clock signal line, the third clock signal line, and the fourth clock signal line; and the connection line is arranged corresponding to each overlapping region.

2. The display panel according to claim 1, wherein the first signal line comprises at least two sub-signal lines, two neighboring sub-signal lines are respectively arranged at two sides of the overlapping region, and the two neighboring sub-signal lines are connected through the connection line.

3. The display panel according to claim 2, wherein the connection line comprises a first sub-connection line, a second sub-connection line, and a third sub-connection line, and the first sub-connection line and the third sub-connection line are arranged symmetrically relative to the second sub-connection line.

4. The display panel according to claim 3, wherein a clearance between an outer edge of the first sub-connection line and an outer edge of the third sub-connection line is greater than line widths of both the two neighboring sub-signal lines.

5. The display panel according to claim 2, wherein a clearance between the two neighboring sub-signal lines is greater than a width of the overlapping region.

6. The display panel according to claim 2, wherein a clearance between the two neighboring sub-signal lines is equal to a width of the overlapping region.

7. The display panel according to claim 1, wherein the connection line comprises a first sub-connection line and a second sub-connection line, and the first sub-connection line and the second sub-connection line are arranged in parallel.

8. The display panel according to claim 7, wherein a length of the first sub-connection line and a length of the second sub-connection line are equal to a length of the first signal line.

9. A display panel, comprising:
a first signal line; and
a second signal line, wherein the first signal line and the second signal line are metal layers disposed at different layers at different locations;
an overlapping region is formed at an intersection of the second signal line and the first signal line; and
the first signal line comprises a connection line, the connection line comprises at least two sub-connection lines, and the connection line crosses the overlapping region;
wherein the display panel further comprises:
a timing control circuit, configured to provide drive timing of a scanning drive circuit; and
the scanning drive circuit, configured to drive a scan line of the display panel, wherein
one end of the first signal line is connected to the scanning drive circuit, and the other end of the first signal line is connected to the second signal line; and
the second signal line is connected to the timing control circuit;
wherein the scanning drive circuit comprises a plurality of shift register chips; each shift register chip corresponds to a group of first signal lines; each group of first signal lines comprises a first transmission signal line, a second transmission signal line, and a third transmission signal line; and the second signal line comprises a power line, a first clock signal line, and a second clock signal line; and
the power line is connected to the first transmission signal line; the first transmission signal line crosses the first clock signal line and the second clock signal line to respectively form two overlapping regions, the second transmission signal line is connected to the first clock signal line to form an overlapping region, the third transmission signal line is connected to the second clock signal line, and the connection line is arranged corresponding to each overlapping region.

10. A display panel, comprising:
a first signal line; and
a second signal line, wherein an overlapping region is formed at an intersection of the second signal line and the first signal line; and
the first signal line comprises a connection line, the connection line comprises at least two sub-connection lines, and the first signal line further comprises two neighboring sub-signal lines, and the two neighboring sub-signal lines are connected through the connection line; a clearance between the two neighboring sub-signal lines is equal to a width of the overlapping region; the connection line comprises a first sub-connection line, a second sub-connection line, and a third sub-connection line; the first sub-connection line and the third sub-connection line are arranged symmetrically relative to the second sub-connection line; a line length of the second sub-connection line is less than a line length of the first sub-connection line and a line length of the third sub-connection line, and the line length of the first sub-connection line is equal to the line length of the third sub-connection line; and a clearance of the connection line is greater than a line width of the signal line, a clearance between a first edge of the first sub-connection line and a first edge of the third sub-connection line is greater than the line width of the signal line, and the connection line is arranged corresponding to each overlapping region.

11. A display apparatus, comprising:
a first signal line; and a second signal line, wherein the first signal line and the second signal line are different metal layers disposed at different layers at different locations; an overlapping region is formed at an intersection of the second signal line and the first signal line; and the first signal line comprises a connection line, the connection line comprises at least two sub-connection lines, and the connection line crosses the overlapping region; wherein the display apparatus further comprises:
a timing control circuit, configured to provide drive timing of a scanning drive circuit; and the scanning drive circuit, configured to drive a scan line of the display apparatus, wherein one end of the first signal line is connected to the scanning drive circuit, and the other end of the first signal line is connected to the second signal line; and
the second signal line is connected to the timing control circuit; wherein the scanning drive circuit comprises a plurality of shift register chips; each shift register chip corresponds to a group of first signal lines; each group of first signal lines comprises a first transmission signal line and a second transmission signal line; and starting from an end away from the shift register chips, the second signal line comprises a power line, a first clock signal line, a second clock signal line, a third clock signal line, and a fourth clock signal line in sequence; and the first transmission signal line is connected to the power line; the first transmission signal line crosses the first clock signal line, the second clock signal line, the third clock signal line, and the fourth clock signal line to respectively form four overlapping regions; every four neighboring shift register chips form one group, and the second transmission signal line is sequentially connected to the first clock signal line, the second clock signal line, the third clock signal line, and the fourth clock signal line; and the connection line is arranged corresponding to each overlapping region.

12. The display apparatus according to claim 11, wherein the first signal line comprises at least two sub-signal lines, two neighboring sub-signal lines are respectively arranged at two sides of the overlapping region, and the two neighboring sub-signal lines are connected through the connection line.

13. The display apparatus according to claim 12, wherein the connection line comprises a first sub-connection line, a second sub-connection line, and a third sub-connection line;
the first sub-connection line and the third sub-connection line are arranged symmetrically relative to the second sub-connection line; and
a clearance between an outer edge of the first sub-connection line and an outer edge of the third sub-connection line is greater than line widths of both the two neighboring sub-signal lines.

14. The display apparatus according to claim 12, wherein a clearance between the two neighboring sub-signal lines is greater than or equal to a width of the overlapping region.

15. The display apparatus according to claim 11, wherein the connection line comprises a first sub-connection line and a second sub-connection line, and the first sub-connection line and the second sub-connection line are arranged in parallel; and a length of the first sub-connection line and a length of the second sub-connection line are equal to a length of the first signal line.

* * * * *